United States Patent
Park et al.

(10) Patent No.: US 12,419,159 B2
(45) Date of Patent: Sep. 16, 2025

(54) DISPLAY DEVICE HAVING SURFACE CONTROL LAYER IN TRANSMISSION AREA

(71) Applicant: Samsung Display Co., LTD., Yongin-si (KR)

(72) Inventors: Heemin Park, Hwaseong-si (KR); Joongu Lee, Seoul (KR); Hye Jin Gwark, Suwon-si (KR); Jaeik Kim, Seoul (KR); Jungsun Park, Yongin-si (KR); Yeonhwa Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 576 days.

(21) Appl. No.: 17/502,044

(22) Filed: Oct. 15, 2021

(65) Prior Publication Data

US 2022/0123081 A1   Apr. 21, 2022

(30) Foreign Application Priority Data

Oct. 16, 2020   (KR) .................. 10-2020-0134648

(51) Int. Cl.
*H10K 59/123* (2023.01)
*H10K 50/17* (2023.01)
(Continued)

(52) U.S. Cl.
CPC ......... *H10K 59/123* (2023.02); *H10K 50/844* (2023.02); *H10K 59/1213* (2023.02);
(Continued)

(58) Field of Classification Search
CPC .... H10K 59/65; H10K 59/122; H10K 50/844; H10K 59/123; H10K 59/1213;
(Continued)

(56) References Cited

U.S. PATENT DOCUMENTS 9,632,487 B2    4/2017   Kim et al.
10,074,705 B2   9/2018   Chung et al.
(Continued)

FOREIGN PATENT DOCUMENTS

| CN | 110767736 | 2/2020 |
| KR | 10-2017-0015632 | 2/2017 |
| KR | US10074705 | 11/2017 |
| KR | 10-2019-0082362 A | 7/2019 |

*Primary Examiner* — William B Partridge
*Assistant Examiner* — David Paul Sedorook
(74) *Attorney, Agent, or Firm* — Womble Bond Dickinson (US) LLP

(57) ABSTRACT

A display device includes: a substrate on which a pixel area for displaying an image and a transmission area for transmitting an external light are defined; a transistor disposed on the substrate in the pixel area; a first electrode disposed on the transistor in the pixel area and electrically connected to the transistor; a pixel defining layer exposing at least a portion of the first electrode; an emission layer disposed on the first electrode in the pixel area; a surface control layer disposed on the substrate in the transmission area; at least one dam disposed between the pixel area and the transmission area and surrounding the surface control layer; and a second electrode disposed on the emission layer.

27 Claims, 17 Drawing Sheets

(51) Int. Cl.
*H10K 50/844* (2023.01)
*H10K 59/121* (2023.01)
*H10K 59/122* (2023.01)
*H10K 59/35* (2023.01)
*H10K 59/65* (2023.01)
*H10K 59/80* (2023.01)

(52) U.S. Cl.
CPC ......... *H10K 59/122* (2023.02); *H10K 59/353* (2023.02); *H10K 50/171* (2023.02); *H10K 59/65* (2023.02); *H10K 59/8731* (2023.02)

(58) Field of Classification Search
CPC ............... H10K 59/353; H10K 50/171; H10K 59/8731; H10K 50/16; H10K 59/124; H10K 50/15; H01L 51/5253; H01L 51/5246; H01L 51/5056; H01L 51/5072; H01L 51/5088; H01L 27/3244; H01L 27/3258; H01L 27/3248; H01L 27/3246; H01L 27/3225; H01L 27/3262; H01L 27/3218

See application file for complete search history.

(56) References Cited

U.S. PATENT DOCUMENTS

| | | | |
|---|---|---|---|
| 2009/0009064 A1* | 1/2009 | Lee | C09K 11/06 |
| | | | 313/504 |
| 2015/0091973 A1* | 4/2015 | Ikoshi | B41J 2/01 |
| | | | 523/205 |
| 2016/0014905 A1* | 1/2016 | Tsunekawa | B32B 38/162 |
| | | | 156/60 |
| 2017/0133444 A1* | 5/2017 | Lee | H10K 59/124 |
| 2018/0061722 A1* | 3/2018 | Byun | H01L 22/14 |
| 2018/0102502 A1* | 4/2018 | Kim | H01L 22/12 |
| 2018/0108685 A1* | 4/2018 | Kim | H10K 59/121 |
| 2019/0172881 A1* | 6/2019 | Yoo | H10K 59/122 |
| 2019/0206953 A1 | 7/2019 | Hsieh et al. | |
| 2019/0207155 A1 | 7/2019 | Lee et al. | |
| 2019/0334125 A1* | 10/2019 | Hosono | H10K 71/00 |
| 2020/0395573 A1* | 12/2020 | Zhang | H10K 59/8731 |
| 2021/0083023 A1* | 3/2021 | Zheng | H10K 59/65 |
| 2021/0192983 A1* | 6/2021 | Sui et al. | H10K 50/8426 |
| 2021/0202569 A1* | 7/2021 | Kim | H10K 59/873 |
| 2021/0257589 A1* | 8/2021 | Wang | H10K 71/00 |
| 2021/0336205 A1* | 10/2021 | Wang | H10K 71/00 |

* cited by examiner

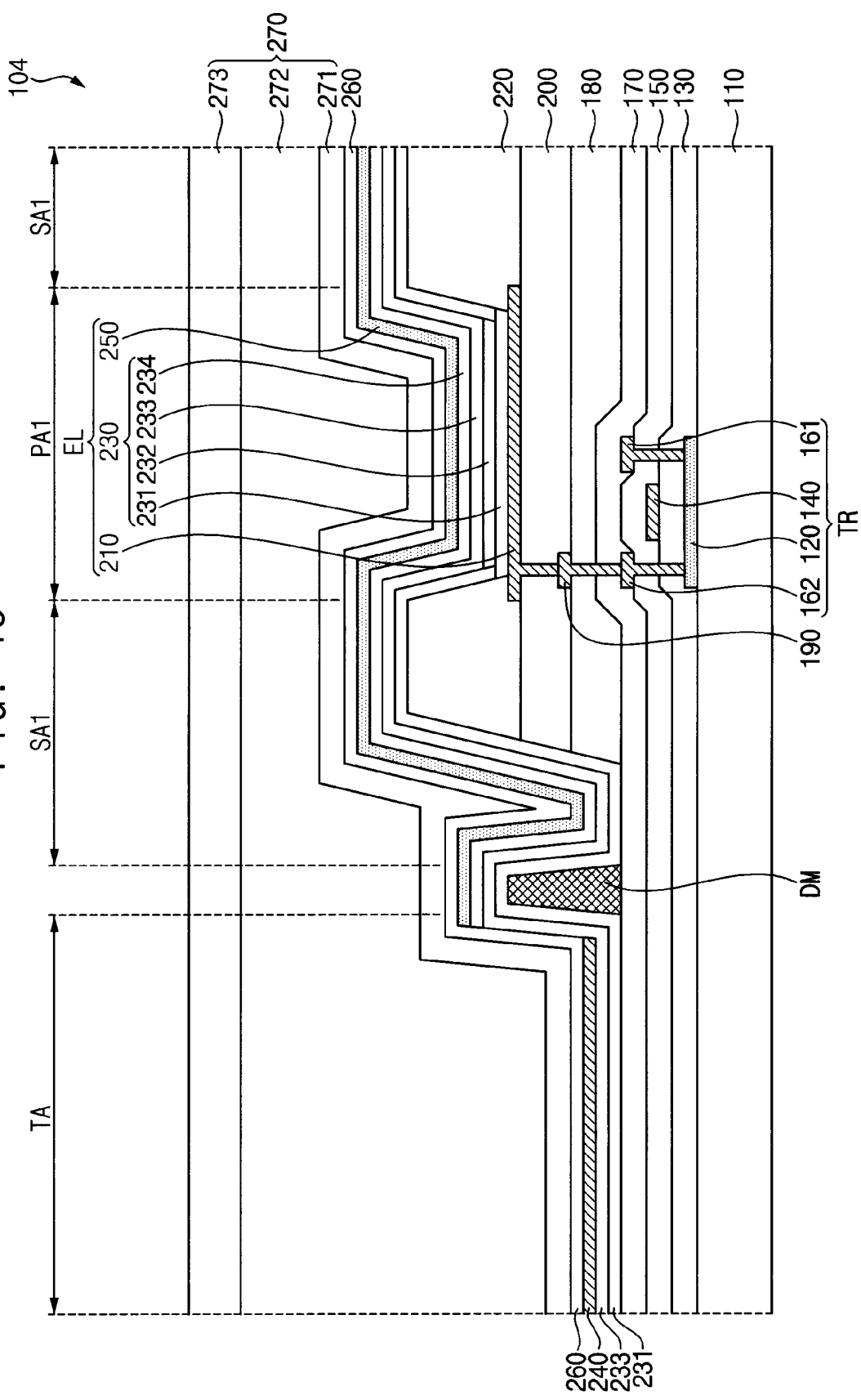

DISPLAY DEVICE HAVING SURFACE CONTROL LAYER IN TRANSMISSION AREA

CROSS-REFERENCE TO RELATED APPLICATION(S)

This application claims priority from and the benefit of Korean Patent Application No. 10-2020-0134648, filed on Oct. 16, 2020, which is hereby incorporated by reference for all purposes as if fully set forth herein.

BACKGROUND

Field

Embodiments of the invention relate generally to a display device, and more particularly, to a display device including a transmission area.

Discussion of the Background

A display device may provide visual information to a user by generating an image based on image data. The display device may include a transmission area that transmits external light incident on the display device. Functional modules (e.g., a camera module, a sensor module, etc.) disposed on a rear surface of the display device may detect or recognize an object, a user, etc. located on a front surface of the display device through the transmission area.

The display device may include light emitting elements emitting light to display an image and an encapsulation layer covering the light emitting elements. The encapsulation layer may protect the light emitting elements by preventing impurities from inflowing and permeating into the display device from the outside. When the impurities inflow into the light emitting elements from the outside, the light emitting elements may deteriorate or pixel shrinkage may occur.

The above information disclosed in this Background section is only for understanding of the background of the inventive concepts, and, therefore, it may contain information that does not constitute prior art.

SUMMARY

Applicant discovered that when display devices having a pixel area and a transmission area are manufactured, impurities may easily inflow and permeate into light emitting elements in the pixel area through the transmission area such that the efficiency and life span of the light emitting elements are degraded or decreased.

Display devices having a pixel area and a transmission area constructed according to the principles of the invention are capable of increasing and improving the efficiency and life span of the light emitting elements of the display devices by providing at least one dam disposed between the pixel area and the transmission area.

Additional features of the inventive concepts will be set forth in the description which follows, and in part will be apparent from the description, or may be learned by practice of the inventive concepts.

According to one or more embodiments, a display device includes: a substrate on which a pixel area for displaying an image and a transmission area for transmitting an external light are defined; a transistor disposed on the substrate in the pixel area; a first electrode disposed on the transistor in the pixel area and electrically connected to the transistor; a pixel defining layer exposing at least a portion of the first electrode; an emission layer disposed on the first electrode in the pixel area; a surface control layer disposed on the substrate in the transmission area; at least one dam disposed between the pixel area and the transmission area and surrounding the surface control layer; and a second electrode disposed on the emission layer.

The at least one dam may have an orthogonal trapezoidal shape in a cross-section view.

The at least one dam may have an inverted trapezoidal shape in a cross-section view.

The at least one dam may include a first dam and a second dam spaced apart from the first dam.

The at least one dam may include at least one of polyimide, silicon nitride, silicon oxide, silicon oxynitride, molybdenum, copper, aluminum oxide, and titanium oxide.

The at least one dam is formed of a material same as a material of the pixel defining layer.

The display device may further include: a first via insulation layer disposed between the transistor and the first electrode in the pixel area; a second via insulation layer disposed between the first via insulation layer and the first electrode in the pixel area; and a connection electrode disposed between the first via insulation layer and the second via insulation layer in the pixel area and connecting the transistor and the first electrode.

The at least one dam may be formed of a material same as a material of at least one of the first via insulation layer and the second via insulation layer.

The second electrode may not overlap the surface control layer.

The display device may further include: an intermediate layer disposed on the first electrode and the pixel defining layer in the pixel area, on the substrate in the transmission area, and on the at least one dam, the intermediate layer including the emission layer and at least one common layer.

The intermediate layer may further include an electron injection layer disposed on the common layer in the pixel area.

The electron injection layer may not overlap the surface control layer.

The at least one common layer may include: a first common layer disposed on the first electrode and the pixel defining layer in the pixel area, on the substrate in the transmission area, and on the at least one dam; and a second common layer disposed on the first common layer.

The emission layer may be disposed between the first common layer and the second common layer, and may overlap the first electrode.

The display device may further include a capping layer disposed on the second electrode in the pixel area and on the surface control layer in the transmission area.

A thickness of the at least one dam may be greater than a sum of a thickness of the first common layer, a thickness of the second common layer, a thickness of the surface control layer, and a thickness of the capping layer.

The display device may further include agglomerated particles disposed on the surface control layer and formed of a material same as a material of the second electrode.

The surface control layer may include a fluorine compound.

The fluorine compound may include at least one of a difluoromethylene group, a trifluoromethyl group, and a fluorosilane.

The second electrode may include at least one of magnesium (Mg), silver (Ag), aluminum (Al), lithium (Li), calcium (Ca), indium (In), and ytterbium (Yb).

The display device may further include an encapsulation layer disposed on the second electrode in the pixel area and on the surface control layer in the transmission area.

The encapsulation layer may include: a first inorganic encapsulation layer; an organic encapsulation layer disposed on the first inorganic encapsulation layer; and a second inorganic encapsulation layer disposed on the organic encapsulation layer.

The first inorganic encapsulation layer may cover the at least one dam.

According to another one or more embodiments, a display device includes: a substrate on which a pixel area for displaying an image and a transmission area for transmitting an external light are defined; a light emitting element disposed in the pixel area, the light emitting element including: a first electrode disposed on the substrate in the pixel area; a second electrode disposed to face the first electrode; and an intermediate layer disposed between the first electrode and the second electrode and including a first layer contacting the first electrode and a second layer contacting the second electrode; at least one dam surrounding the transmission area; and a surface control layer disposed on the substrate in the transmission area, wherein: the first layer of the intermediate layer extends from the pixel area to cover the at least one dam and to overlap the surface control layer in the transmission area, and the second layer of the intermediate layer extends from the pixel area to cover the at least one dam and not to overlap the surface control layer in the transmission area.

The first layer of the intermediate layer may include a common layer, and the second layer of the intermediate layer may include an electron injection layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIGS. 12, 13, 14, 15, 16, 17, 18, and 19 are diagrams illustrating an embodiment of a method of manufacturing a display device according to the principles of the invention.

DETAILED DESCRIPTION OF THE EMBODIMENTS

Figure 1:
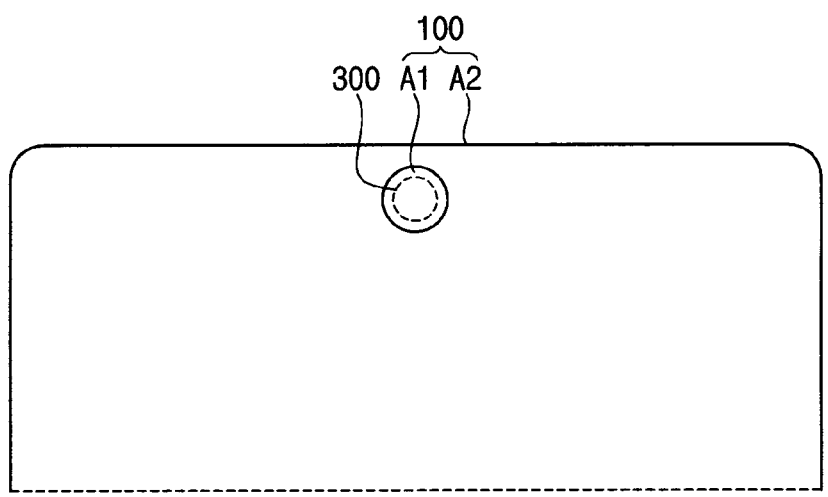
FIG. 1 is a plan view of a portion of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. As used herein, the term "in plan view" is used to describe a view from a point normal to a substrate or plane containing the elements.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an embodiment will be described with reference to FIGS. 1, 2, 3, 4, 5, 6, and 7.

FIG. 1 is a plan view illustrating a portion of a display device according to an embodiment.

Referring to FIG. 1, a display device 100 according to an embodiment may include a first area A1 and a second area A2. Each of the first area A1 and the second area A2 may be a display area for displaying an image. The first area A1 may include a transmission area transmitting external light. As the first area A1 includes the transmission area, a transmittance of the first area A1 may be greater than a transmittance of the second area A2. In other words, the transmittance of the second area A2 may be less than the transmittance of the first area A1. The first area A1 may transmit external light incident into the first area A1 while displaying an image.

The first area A1 and the second area A2 may be positioned to be adjacent to each other. In an embodiment, the second area A2 may surround at least a portion of the first area A1. For example, the first area A1 may be disposed inside the display device 100 to be spaced apart from an edge of the display device 100 in a plan view, and the second area A2 may entirely surround the first area A1.

In an embodiment, the first area A1 may have a circular shape in a plan view. However, embodiments are not limited thereto, and in another embodiment, the first area A1 may have various polygonal shapes in a plan view.

A functional module 300 may be disposed on a rear surface of the display device 100. The functional module 300 may be disposed in the first area A1 in a plan view. The functional module 300 may receive external light passing through the first area A1.

In an embodiment, the functional module 300 may include a camera module for capturing or generating an image of an object located on a front surface of the display device 100, a face recognition sensor module for detecting a face of a user, a pupil recognition sensor for detecting an eye of the user, an acceleration sensor module and a geomagnetic sensor module for determining the movement of the display device 100, a proximity sensor module and an infrared sensor module for detecting whether the front surface of the display device is close, and an illumination sensor module for measuring the degree of external brightness, or the like.

Figure 2:
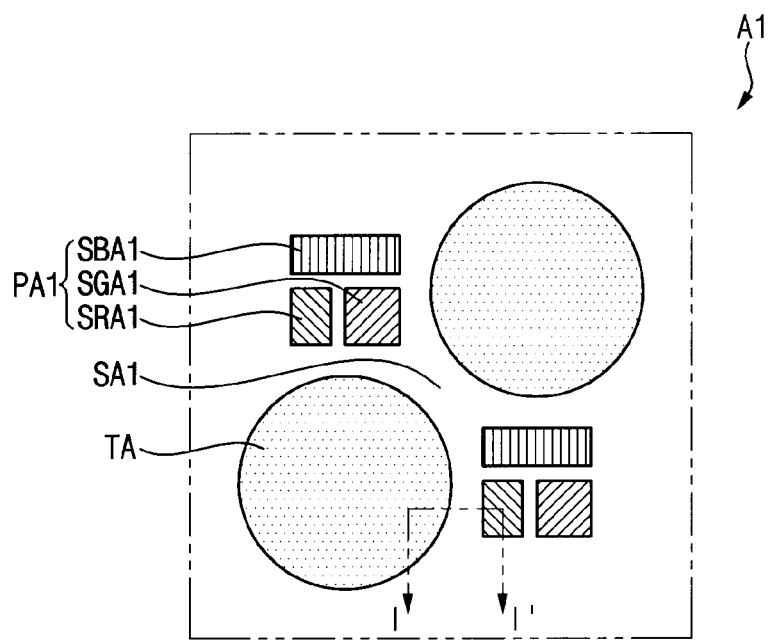
FIG. 2 is a plan view of a first area of the display device of FIG. 1.
Figure 3:
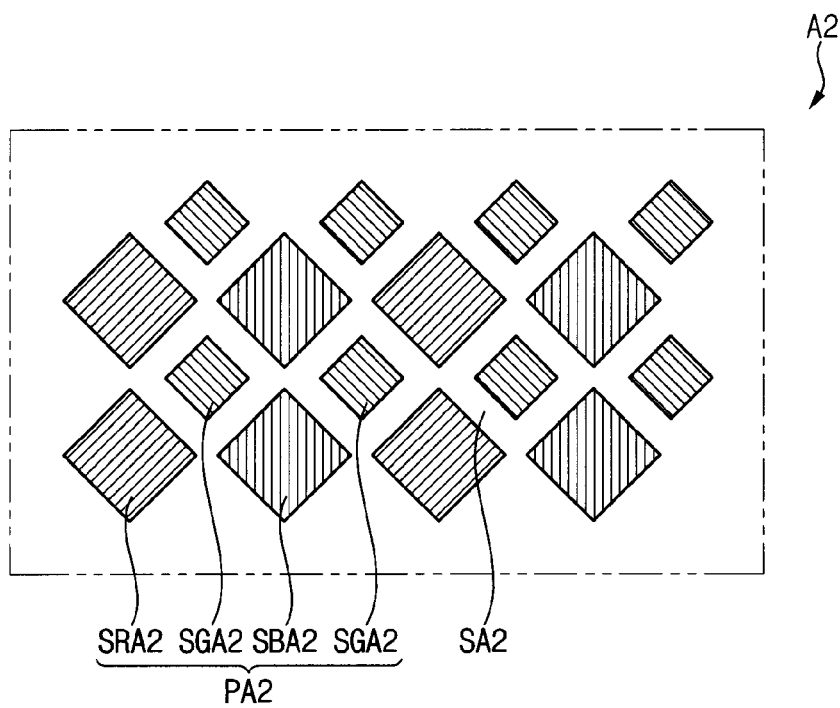
FIG. 3 is a plan view of a second area the display device of FIG. 1.

FIG. 2 is a plan view illustrating the first area A1 in FIG. 1. FIG. 3 is a plan view illustrating the second area A2 in FIG. 1.

Referring to FIGS. 1, 2, and 3, the first area A1 may include a first pixel area PA1, a transmission area TA, and a first surrounding area SA1, and the second area A2 may include a second pixel area PA2 and a second surrounding area SA2. Each of the first pixel area PA1 and the second pixel area PA2 may be an area in which pixels are disposed and from which light generated from each of the pixels is emitted. For example, the first surrounding area SA1 may surround the first pixel area PA1 and the transmission area TA, e.g., in a plan view. The second surrounding area SA2 may surround the second pixel area PA2, e.g., in a plan view.

The first pixel area PA1 may include a plurality of first sub-pixel areas SRA1, SGA1, and SBA1 which emit lights having different colors, and the second pixel area PA2 may include a plurality of second sub-pixel areas SRA2, SGA2, and SBA2 which emits light having different colors. In an embodiment, the first sub-pixel areas SRA1, SGA1, and SBA1 may include a first red pixel area SRA1 emitting red light, a first green pixel area SGA1 emitting green light, and a first blue pixel area SBA1 emitting blue light, and the second sub-pixel areas SRA2, SGA2, and SBA2 may include a second red pixel area SRA2 emitting red light, a second green pixel area SGA2 emitting green light, and a second blue pixel area SBA2 emitting blue light.

The transmission area TA may be an area transmitting external light incident into the display device 100. As the first area A1 includes the transmission area TA transmitting the external light, the functional module 300 disposed on the rear surface of the display device 100 corresponding to the first area A1 may detect or recognize an object or a user located on the front surface of the display device 100 through the transmission area TA. The first surrounding area SA1 may surround the first pixel area PA1 and the transmission area TA. The second surrounding area SA2 may surround the second pixel area PA2. Each of the first surrounding area SA1 and the second surrounding area SA2 may be an area that does not emit light and does not transmit external light.

As the first area A1 includes the transmission area TA, the number of the first sub-pixel areas SRA1, SGA1, and SBA1 per a unit area may be less than the number of the second sub-pixel areas SRA2, SGA2, and SBA2 per the unit area. In other words, a resolution of the first area A1 may be less than a resolution of the second area A2.

In an embodiment, an arrangement structure of the first sub-pixel areas SRA1, SGA1, and SBA1 may be different from an arrangement structure of the second sub-pixel areas SRA2, SGA2, and SBA2. For example, the first sub-pixel areas SRA1, SGA1, and SBA1 may be arranged in a stripe manner, and the second sub-pixel areas SRA2, SGA2, and SBA2 may be arranged in a PenTile® manner. For example, the first pixel area PA1 may include one first red pixel area SRA1, one first green pixel area SRG1, and one first blue pixel area SBA1. The second pixel area PA2 may include one second red pixel area SRA2, two second green pixel areas SRG2 and one second blue pixel area SBA2. However, embodiments are not limited thereto, and in another embodiment, the arrangement structure of the first sub-pixel areas SRA1, SGA1, and SBA1 may be substantially the same as the arrangement structure of the second sub-pixel areas SRA2, SGA2, and SBA2. For example, each of the first sub-pixel areas SRA1, SGA1, and SBA1 and the second sub-pixel areas SRA2, SGA2, and SBA2 may be arranged in the PenTile manner.

The transmission area TA may have various shapes in a plan view. In an embodiment, the transmission area TA may have a circular shape in a plan view as illustrated in FIG. 2. However, embodiments are not limited thereto, and in another embodiment, the transmission area TA may have an octagonal shape, a hexadecagonal shape, or the like in a plan view.

Figure 4:
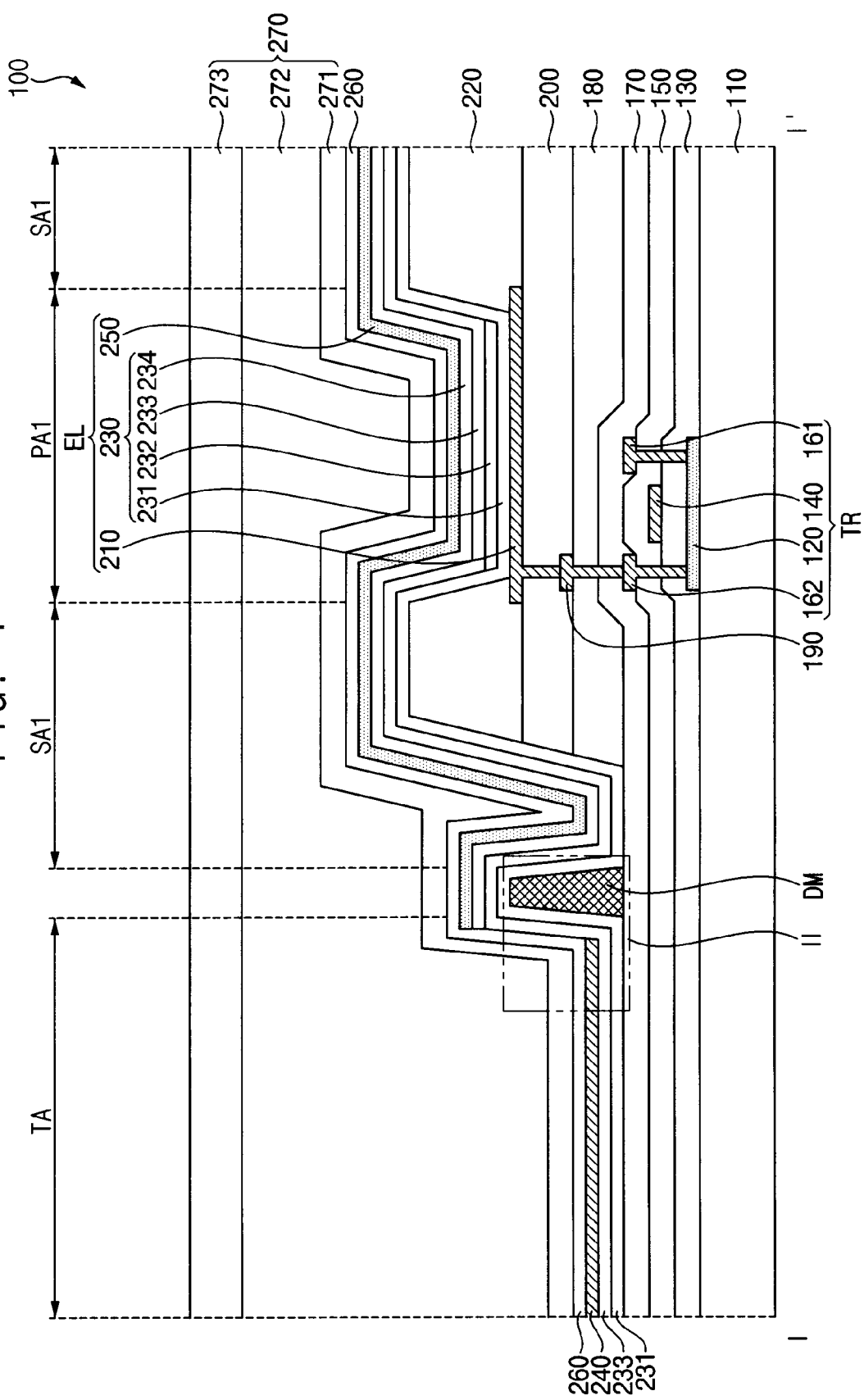
FIG. 4 is a cross-sectional view taken along a line I-I' of FIG. 2.
Figure 5:
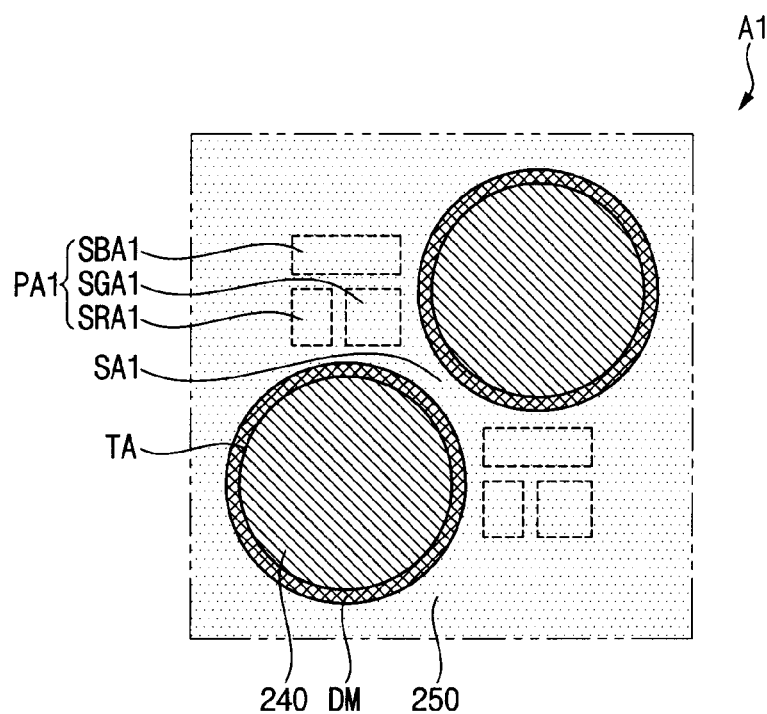
FIG. 5 is a plan view of a dam, a surface control layer, and a second electrode of FIG. 4.

FIG. 4 is a cross-sectional view illustrating the display device 100 taken along a line I-I! in FIG. 2. FIG. 5 is a plan view illustrating a dam, a surface control layer, and a second electrode in FIG. 4.

A cross-sectional structure of the second pixel area PA2 and the second surrounding area SA2 of the second area A2 may be substantially the same as or similar to a cross-sectional structure of the first pixel area PA1 and the first surrounding area SA1 of the first area A1, respectively. Accordingly, descriptions will be focused on the first area A1 for descriptive convenience.

Referring to FIGS. 2, 3, 4, and 5, the display device 100 may include a substrate 110, an active layer 120, a plurality of conductive layers 140, 161, 162, and 190, a plurality of inorganic insulation layers 130, 150, and 170, a plurality of organic insulation layer 180 and 200, a first electrode 210, a pixel defining layer 220, an intermediate layer 230, a surface control layer 240, a second electrode 250, a capping layer 260, and an encapsulation layer 270.

The substrate 110 may be a transparent insulation substrate. For example, the substrate 110 may be formed of glass, quartz, plastic, or the like.

The active layer 120 and the conductive layers 140, 161, 162, and 190 positioned in different layers from each other may be disposed on the substrate 110. The conductive layers 140, 161, 162, and 190 may include a gate electrode 140, a source electrode 161, a drain electrode 162, and a connection electrode 190. The active layer 120 and the conductive layers 140, 161, 162, and 190 may be disposed in the first pixel area PA1, the first surrounding area SA1, the second pixel area PA2, and the second surrounding area SA2.

The inorganic insulation layers 130, 150, and 170 and the organic insulation layers 180 and 200 insulating between the active layer 120 and the conductive layers 140, 161, 162, and 190 may be disposed on the substrate 110. The inorganic insulation layers 130, 150, and 170 may include a gate insulation layer 130, an insulation interlayer 150, and a passivation layer 170. The organic insulation layers 180 and 200 may include a first via insulation layer 180 and a second via insulation layer 200.

The active layer 120 may be disposed on the substrate 110. The active layer 120 may be formed of amorphous silicon, polycrystalline silicon, an oxide semiconductor, or the like. The active layer 120 may include a source region, a drain region, and a channel region disposed between the source region and the drain region. P-type or N-type impurities may be doped in the source region and the drain region.

The gate insulation layer 130 may be disposed on the active layer 120. The gate insulation layer 130 may cover the active layer 120 on the substrate 110. The gate insulation layer 130 may insulate the gate electrode 140 from the active layer 120. The gate insulation layer 130 may be formed of an inorganic insulation material such as silicon nitride, silicon oxide, silicon oxynitride, or the like.

In an embodiment, the gate insulation layer 130 may be disposed in the first pixel area PA1, the transmission area TA, the first surrounding area SA1, the second pixel area PA2, and the second surrounding area SA2. However, embodiments are not limited thereto, and the gate insulation layer 130 may be disposed in the first pixel area PA1, the first surrounding area SA1, the second pixel area PA2 and the second surrounding area SA2, and may not be disposed in the transmission area TA.

The gate electrode 140 may be disposed on the gate insulation layer 130. The gate electrode 140 may overlap the channel region of the active layer 120. The gate electrode 140 may be formed of a conductive material such as metal, an alloy of metal, or the like. For example, the gate electrode 140 may be formed of molybdenum (Mo), copper (Cu), or the like.

The insulation interlayer 150 may be disposed on the gate electrode 140. The insulation interlayer 150 may cover the gate electrode 140 on the gate insulation layer 130. The insulation interlayer 150 may insulate the source electrode 161 and the drain electrode 162 from the gate electrode 140. The insulation interlayer 150 may be formed of an inorganic insulation material such as silicon nitride, silicon oxide, silicon oxynitride, or the like.

In an embodiment, the insulation interlayer 150 may be disposed in the first pixel area PA1, the transmission area TA, the first surrounding area SA1, the second pixel area PA2, and the second surrounding area SA2. However, embodiments are not limited thereto, and the insulation interlayer 150 may be disposed in the first pixel area PA1, the first surrounding area SA1, the second pixel area PA2 and the second surrounding area SA2, and may not be disposed in the transmission area TA.

The source electrode 161 and the drain electrode 162 may be disposed on the insulation interlayer 150. The source electrode 161 may be connected to the source region of the active layer 120, and the drain electrode 162 may be connected to the drain region of the active layer 120. The source electrode 161 and the drain electrode 162 may be formed of a conductive material such as metal, an alloy of metal, or the like. For example, the source electrode 161 and the drain electrode 162 may be formed of aluminum (Al), titanium (Ti), copper (Cu), or the like. The active layer 120, the gate electrode 140, the source electrode 161, and the drain electrode 162 may constitute a transistor TR. The transistor TR may be disposed in the first pixel area PA1 and the second pixel area PA2.

The passivation layer 170 may be disposed on the source electrode 161 and the drain electrode 162. The passivation layer 170 may cover the source electrode 161 and the drain electrode 162 on the insulation interlayer 150. The passivation layer 170 may protect the transistor TR. The passivation layer 170 may be formed of an inorganic insulation material such as silicon nitride, silicon oxide, silicon oxynitride, or the like.

In an embodiment, the passivation layer 170 may be disposed in the first pixel area PA1, the transmission area TA, the first surrounding area SA1, the second pixel area PA2, and the second surrounding area SA2. However, embodiments are not limited thereto, and the passivation layer 170 may be disposed in the first pixel area PA1, the first surrounding area SA1, the second pixel area PA2 and the second surrounding area SA2, and may not be disposed in the transmission area TA.

The first via insulation layer 180 may be disposed on the passivation layer 170. The first via insulation layer 180 may provide a planarized surface over the transistor TR. The first via insulation layer 180 may be formed of an organic insulation material such as polyimide (PI) or the like. The first via insulation layer 180 may be disposed in the first pixel area PA1, the first surrounding area SA1, the second pixel area PA2 and the second surrounding area SA2, and may not be disposed in the transmission area TA.

The connection electrode 190 may be disposed on the first via insulation layer 180. The connection electrode 190 may be connected to the drain electrode 162. The connection electrode 190 may be formed of a conductive material such as metal, an alloy of metal, or the like. For example, the connection electrode 190 may be formed of aluminum (Al), titanium (Ti), copper (Cu), or the like.

The second via insulation layer 200 may be disposed on the connection electrode 190. The second via insulation layer 200 may cover the connection electrode 190 on the first via insulation layer 180. The second via insulation layer 200 may be formed of an organic insulation material such as polyimide (PI) or the like. The second via insulation layer 200 may be disposed in the first pixel area PA1, the first surrounding area SA1, the second pixel area PA2 and the second surrounding area SA2, and may not be disposed in the transmission area TA.

The first electrode 210 may be disposed on the second via insulation layer 200. The first electrode 210 may be connected to the connection electrode 190. In other words, the connection electrode 190 may connect the transistor TR and the first electrode 210. The first electrode 210 may be disposed in the first pixel area PA1 and the second pixel area PA2. The first electrode 210 may be formed of a conductive material such as metal, transparent conductive oxide, or the like.

The pixel defining layer 220 may be disposed on the first electrode 210. The pixel defining layer 220 may include a pixel opening that exposes at least a portion (e.g., a central portion) of the first electrode 210 in order to define the first pixel area PA1 and the second pixel area PA2. Further, the pixel defining layer 220 may space the second electrode 250 from an edge of the first electrode 210 in order to prevent electrical arc or the like occurring between the edge of the first electrode 210 and the second electrode 250. The pixel defining layer 220 may be formed of an organic insulation material such as polyimide (PI) or the like. The pixel defining layer 220 may be disposed in the first surrounding area SA1 and the second surrounding area SA2, and may not be disposed in the first pixel area PA1, the transmission area TA, and the second pixel area PA2.

At least one dam DM may be disposed between the first pixel area PA1 and the transmission area TA on the passivation layer 170. For example, the dam DM may be disposed at a boundary between the transmission area TA and the first surrounding area SA1. The dam DM may surround the transmission area TA in a plan view. Further, the first surrounding area SA1 may surround the dam DM in a plan view. In an embodiment, the dam DM may have a single-layer structure.

The dam DM may include a material capable of inhibiting or preventing moisture permeation. In an embodiment, the dam DM may include at least one of polyimide (PI), silicon nitride (SiN$_X$), silicon oxide (SiO$_X$), silicon oxynitride (SiO$_X$N$_Y$), molybdenum (Mo), copper (Cu), aluminum oxide (AlO$_X$), and titanium oxide (TiO$_X$).

In an embodiment, the dam DM may include a material that is substantially the same as a material of the pixel defining layer 220. In such an embodiment, the dam DM may be substantially simultaneously formed with the pixel defining layer 220.

The intermediate layer 230 may be disposed on the first electrode 210 in the first pixel area PA1 and the second pixel area PA2, on the pixel defining layer 220 in the first surrounding area SA1 and the second surrounding area SA2, on the passivation layer 170 in the transmission area TA, and on the dam DM. The intermediate layer 230 may include an emission layer 232 and at least one common layer. In an embodiment, the intermediate layer 230 may include a first common layer 231, the emission layer 232, a second common layer 233, and an electron injection layer 234.

The first common layer 231 may be disposed on the first electrode 210 in the first pixel area PA1 and the second pixel area PA2, on the pixel defining layer 220 in the first surrounding area SA1 and the second surrounding area SA2, on the passivation layer 170 in the transmission area TA, and on the dam DM. The first common layer 231 may have a single-layer structure or a multilayer structure. The first common layer 231 may include a hole injection layer and/or a hole transport layer. The first common layer 231 may further include functional layers other than the hole injection layer and the hole transport layer.

The emission layer 232 may be disposed on the first common layer 231. The emission layer 232 may overlap the first electrode 210. The emission layer 232 may be disposed in the first pixel area PA1 and the second pixel area PA2, and may not be disposed in the transmission area TA, the first surrounding area SA1, and the second surrounding area SA2. The emission layer 232 may include at least one of an organic light emitting material and a quantum dot.

In an embodiment, the organic light emitting material may include a low molecular organic compound or a high molecular organic compound. For example, the low molecular organic compound may include copper phthalocyanine, N, N'-diphenylbenzidine, tris-(8-hydroxyquinoline)aluminum, or the like. The high molecular organic compound may include poly(3,4-ethylenedioxythiophene), polyaniline, polyphenylenevinylene, polyfluorene, or the like.

In an embodiment, the quantum dot may include a core including a group II-VI compound, a group III-V compound, a group IV-VI compound, a group IV element, a group IV compound, and a combination thereof. In an embodiment, the quantum dot can have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

The second common layer 233 may be disposed on the first common layer 231 and the emission layer 232. The second common layer 233 may have a single-layer structure or a multilayer structure. The second common layer 233 may include an electron transport layer. The second common layer 233 may further include functional layers other than the electron transport layer. The second common layer 233 may be disposed in the first pixel area PA1, the transmission area TA, the first surrounding area SA1, the second pixel area PA2 and the second surrounding area SA2.

The surface control layer 240 may be disposed on the intermediate layer 230 in the transmission area TA. The surface control layer 240 may be disposed in the transmission area TA, and may not be disposed in the first pixel area PA1, the first surrounding area SA1, the second pixel area PA2, and the second surrounding area SA2.

The surface control layer 240 may include fluorine (F) compounds. In an embodiment, the fluorine compounds may include at least one of difluoromethylene group, trifluoromethyl group, and fluorosilane. For example, the surface control layer 240 may be a low surface tension layer or a dirt-prevention layer that is formed by being treated with the fluorine (F) compounds.

In an embodiment, a surface tension of the surface control layer 240 may be greater than 0 mJ/m$^2$ and less than or equal to about 30 mJ/m$^2$ at a room temperature. As the surface control layer 240 has the surface tension of the aforementioned range (i.e., about 0 mJ/m$^2$ to about 30 mJ/m$^2$), an adhesion between the electron injection layer 234 and the surface control layer 240 may be less than an adhesion between the electron injection layer 234 and the second common layer 233, and an adhesion between the second electrode 250 and the surface control layer 240 may be less than an adhesion between the second electrode 250 and the second common layer 233.

The electron injection layer 234 may be disposed on the second common layer 233. The electron injection layer 234 may be disposed in the first pixel area PA1, the first surrounding area SA1, the second pixel area PA2, and the second surrounding area SA2, butd may not be disposed in the transmission area TA.

In an embodiment, the electron injection layer 234 may not overlap the surface control layer 240. As the electron injection layer 234 does not overlap the surface control layer 240, the electron injection layer 234 may not be disposed in the transmission area TA.

The electron injection layer 234 may be formed by a metal self-patterning method. Specifically, when the electron injection layer 234 is formed on the second common layer 233 after forming the surface control layer 240 on the second common layer 233, the electron injection layer 234 may be formed only on a portion of the second common layer 233 on which the surface control layer 240 is not formed by the relatively low adhesion between the electron injection layer 234 and the surface control layer 240. For example, the patterned electron injection layer 234 may be formed without an additional patterning process.

The second electrode 250 may be disposed on the intermediate layer 230. The second electrode 250 may be opposite to the first electrode 210, and the intermediate layer 230 may be between the first electrode 210 and the second electrode 250. The second electrode 250 may be disposed in the first pixel area PA1, the first surrounding area SA1, the second pixel area PA2 and the second surrounding area SA2, and may not be disposed in the transmission area TA.

In an embodiment, the second electrode 250 may include at least one of magnesium (Mg), silver (Ag), aluminum (Al), lithium (Li), calcium (Ca), indium (In), and ytterbium (Yb). The first electrode 210, the intermediate layer 230, and the second electrode 250 may constitute a light emitting element EL. The light emitting element EL may be disposed in the first pixel area PA1 and the second pixel area PA2.

In an embodiment, the second electrode 250 may not overlap the surface control layer 240. As the second electrode 250 does not overlap the surface control layer 240, the second electrode 250 may not be disposed in the transmission area TA.

The second electrode 250 may be formed by a metal self-patterning method. Specifically, when the second electrode 250 is formed on the electron injection layer 234 after forming the surface control layer 240 on the second common layer 233, the second electrode 250 may be formed only on a portion of the second common layer 233 on which the surface control layer 240 is not formed by the relatively low adhesion between the second electrode 250 and the surface control layer 240. For example, the patterned second electrode 250 may be formed without an additional patterning process.

The dam DM may surround the surface control layer 240 in a plan view. Further, the second electrode 250 may surround the dam DM in a plan view. In an embodiment, when the surface control layer 240 has a circular shape in a plan view, the dam DM may have a closed shape (e.g., a circular ring shape, a polygon, or, and an ellipse) that surrounds the surface control layer 240 in a plan view.

The capping layer 260 may be disposed on the surface control layer 240 in the transmission area TA and on the second electrode 250 in the first pixel area PA1, the first surrounding area SA1, the second pixel area PA2, and the second surrounding area SA2. The capping layer 260 may protect the light emitting element EL, and may serve to improve the efficiency of light emitted from the light emitting element EL. The capping layer 260 may include an organic material a-NPD, NPB, TPD, m-MTDARA, Alq$_3$, CuPc, etc. and/or an inorganic material LiF, MgF$_2$, CaF$_2$, etc.

The encapsulation layer 270 may be disposed on the capping layer 260. The encapsulation layer 270 may include at least one inorganic encapsulation layer and at least one organic encapsulation layer.

The encapsulation layer 270 may be disposed on the light emitting element EL, may prevent impurities from inflowing or permeating into the light emitting element EL from the outside, and may protect the light emitting element EL from external shock. The encapsulation layer 270 may have a planarized upper surface throughout the first pixel area PA1, the transmission area TA, the first surrounding area SA1, the second pixel area PA2, and the second surrounding area SA2.

In an embodiment, the encapsulation layer 270 may include a first inorganic encapsulation layer 271 disposed on the capping layer 260, an organic encapsulation layer 272 disposed on the first inorganic encapsulation layer 271, and a second inorganic encapsulation layer 273 disposed on the organic encapsulation layer 272. The first inorganic encapsulation layer 271 and the second inorganic encapsulation layer 273 may reduce or substantially block impurities such as oxygen, moisture, etc. from inflowing or permeating into the light emitting element EL. The organic encapsulation layer 272 may improve the sealing characteristics of the encapsulation layer 270, may relieve or reduce internal stresses of the first inorganic encapsulation layer 271 and the second inorganic encapsulation layer 273, may compensate deficiencies of the first inorganic encapsulation layer 271 and the second inorganic encapsulation layer 273, and may provide a planarized upper surface to the second inorganic encapsulation layer 273.

The first inorganic encapsulation layer 271 may cover the dam DM. A lower portion of the dam DM may contact the passivation layer 170, and an upper surface of the dam DM may contact the first common layer 231. The dam DM may prevent fluorine (F) included in the surface control layer 240 from inflowing or permeating into the light emitting element EL disposed in the first pixel area PA1 from the surface control layer 240 disposed in the transmission area TA. Accordingly, the dam DM may prevent the deterioration of the light emitting element EL and pixel shrinkage due to fluorine (F).

Figure 6:
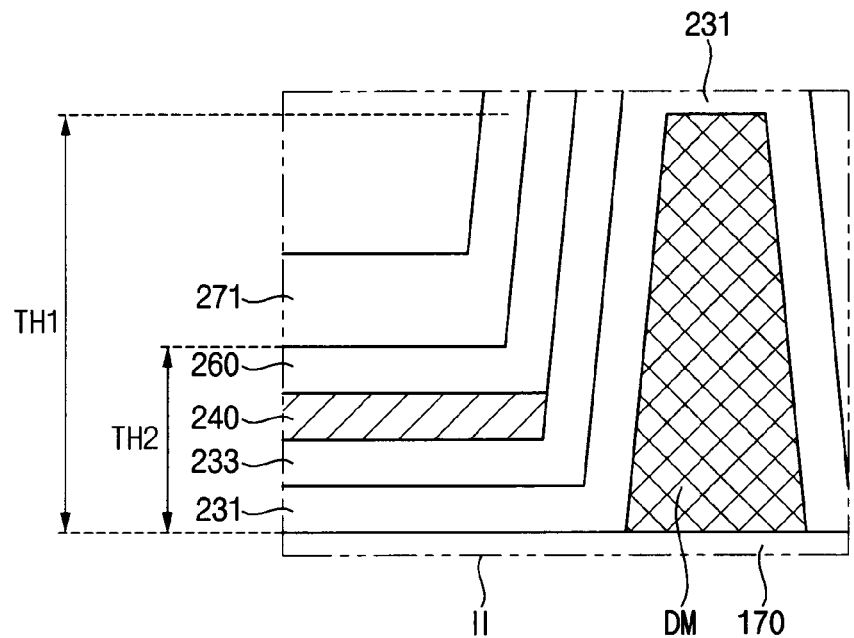
FIGS. 6 and 7 are cross-sectional views of examples of an area II of FIG. 4.
Figure 7:
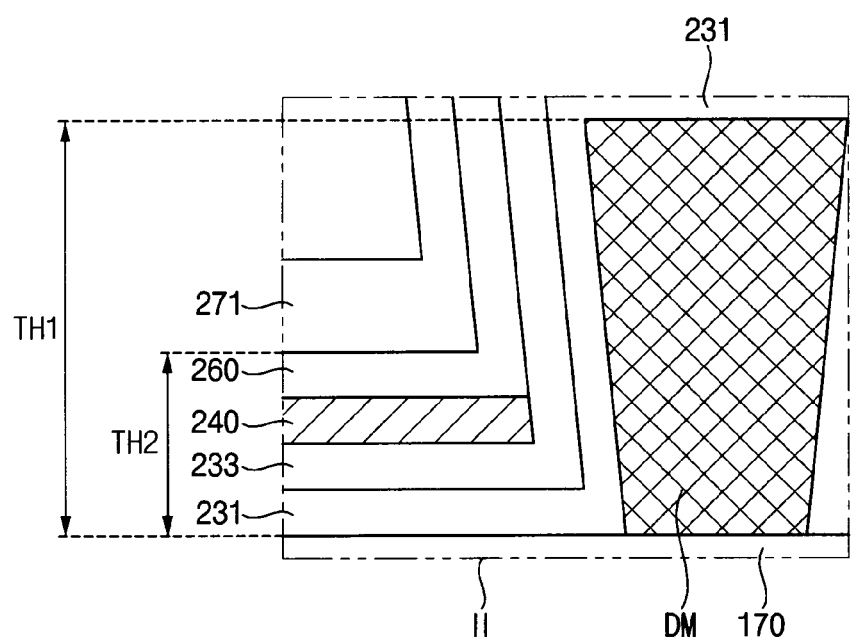

FIGS. 6 and 7 are cross-sectional views illustrating examples of an area II in FIG. 4.

Referring to FIGS. 4 and 6, in an embodiment, the dam DM may have an orthogonal trapezoidal shape in a cross-section view. In such an embodiment, a width of an upper surface of the dam DM that contacts the first common layer 231 may be less than a width of a lower surface of the dam DM that contacts the passivation layer 170.

In an embodiment, a thickness TH1 of the dam DM may be greater than the sum TH2 of a thickness of the first common layer 231, a thickness of the second common layer 233, a thickness of the surface control layer 240, and a thickness of the capping layer 260. Accordingly, the dam DM may separate the first common layer 231, the second common layer 233, and the capping layer 260 disposed in the transmission area TA and the first common layer 231, the second common layer 233, and the capping layer 260 disposed in the first surrounding area SA1. As described above, the first inorganic encapsulation layer 271 may cover the dam DM.

Referring to FIG. 7, in an embodiment, the dam DM may have an inverted trapezoidal shape in a cross-section view. In such an embodiment, the width of the upper surface of the dam DM that contacts the first common layer 231 may be greater than the width of the lower surface of the dam DM that contacts the passivation layer 170.

Hereinafter, a display device according to an embodiment will be described with reference to FIG. 8.

Figure 8:
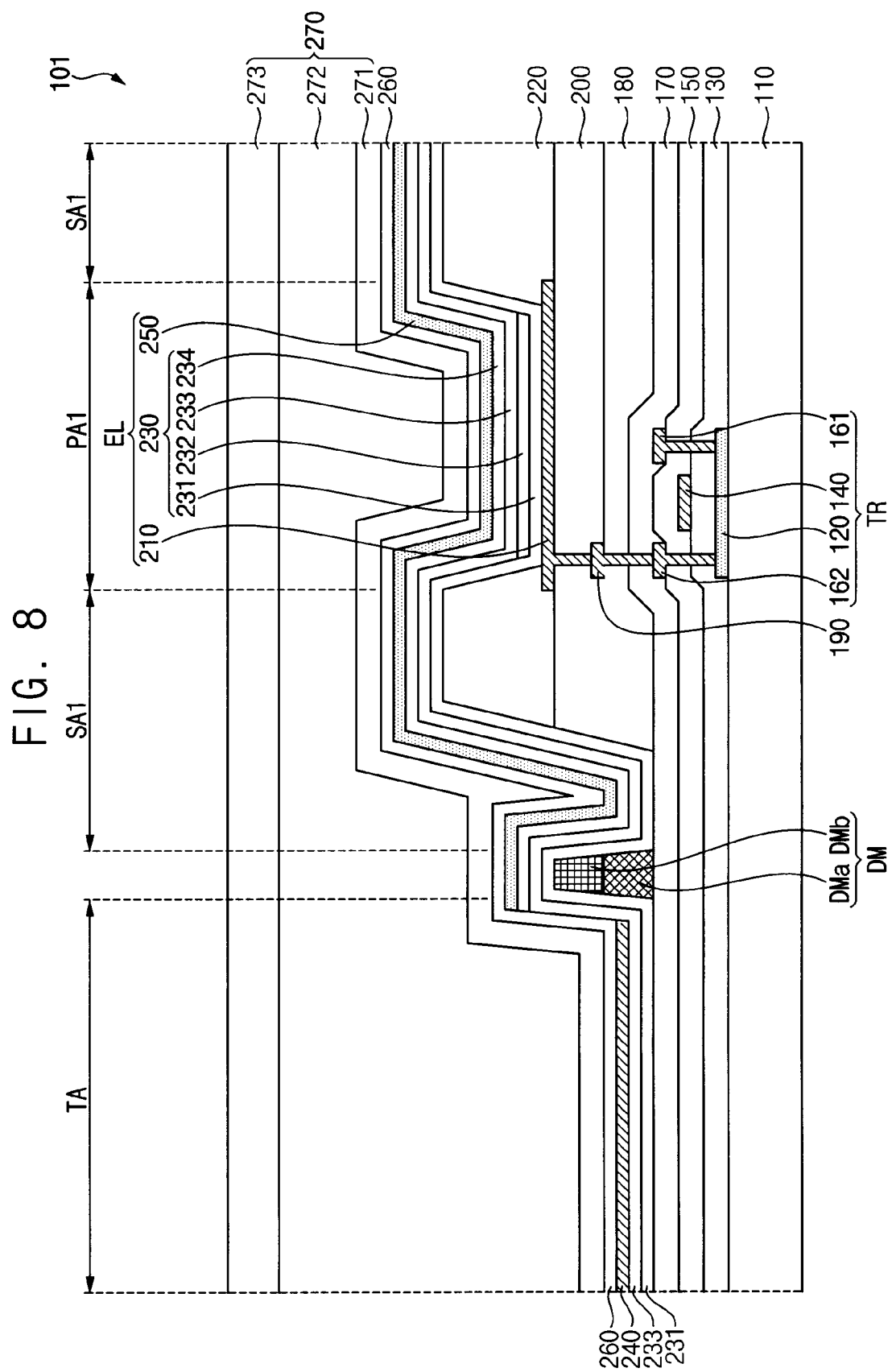
FIG. 8 is a cross-sectional view of another embodiment of the display device of FIG. 1.

FIG. 8 is a cross-sectional view illustrating a display device according to an embodiment. The display device 101 described with reference to FIG. 8 may be substantially the same as or similar to the display device 100 described with reference to FIG. 4 except for the dam DM. Accordingly, descriptions on repeated elements will be omitted for descriptive convenience.

Referring to FIG. 8, in an embodiment, the dam DM may have a multilayer structure including two layers. The dam DM may include a first layer DMa and a second layer DMb disposed on the first layer DMa.

In an embodiment, the dam DM may include a material substantially the same as a material of at least one of the first via insulation layer 180 and the second via insulation layer 200. For example, the first layer DMa of the dam DM may include a material substantially the same as a material of the first via insulation layer 180, and the second layer DMb of the dam DM may include a material substantially the same as a material of the second via insulation layer 200. For example, the first layer DMa of the dam DM may be formed substantially simultaneously with the first via insulation layer 180, and the second layer DMb of the dam DM may be formed substantially simultaneously with the second via insulation layer 200.

Hereinafter, a display device according to an embodiment will be described with reference to FIG. 9.

Figure 9:
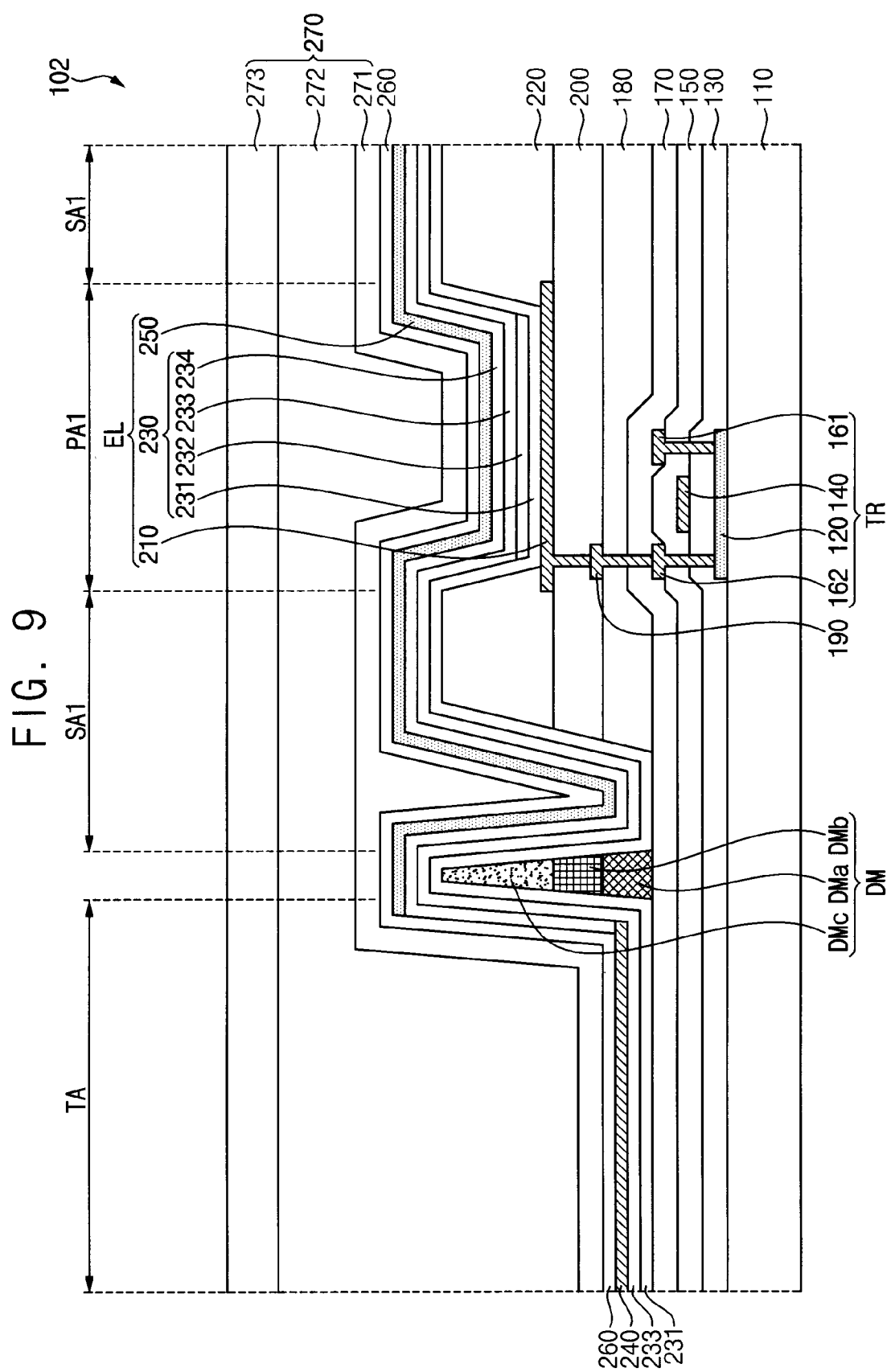
FIG. 9 is a cross-sectional view of another embodiment of the display device of FIG. 1.

FIG. 9 is a cross-sectional view illustrating a display device according to an embodiment. The display device 102 described with reference to FIG. 9 may be substantially the same as or similar to the display device 101 described with reference to FIG. 8 except that the dam DM further includes a third layer. Accordingly, descriptions on repeated elements will be omitted for descriptive convenience.

Referring to FIG. 9, in an embodiment, the dam DM may have a multilayer structure including three layers. For example, the dam DM may have three and more layers. The dam DM may include a first layer DMa, a second layer DMb disposed on the first layer DMa, and a third layer DMc disposed on the second layer DMb.

In an embodiment, the dam DM may include a material substantially the same as a material of at least one of the first via insulation layer 180, the second via insulation layer 200, and the pixel defining layer 220. For example, the first layer DMa of the dam DM may include a material substantially the same as a material of the first via insulation layer 180, the second layer DMb of the dam DM may include a material substantially the same as a material of the second via insulation layer 200, and the third layer DMc of the dam DM may include a material substantially the same as a material of the pixel defining layer 220. For example, the first layer DMa of the dam DM may be formed substantially simultaneously with the first via insulation layer 180, the second layer DMb of the dam DM may be formed substantially simultaneously with the second via insulation layer 200, and the third layer DMc of the dam DM may be formed substantially simultaneously with the pixel defining layer 220.

Hereinafter, a display device according to an embodiment will be described with reference to FIG. 10.

Figure 10:
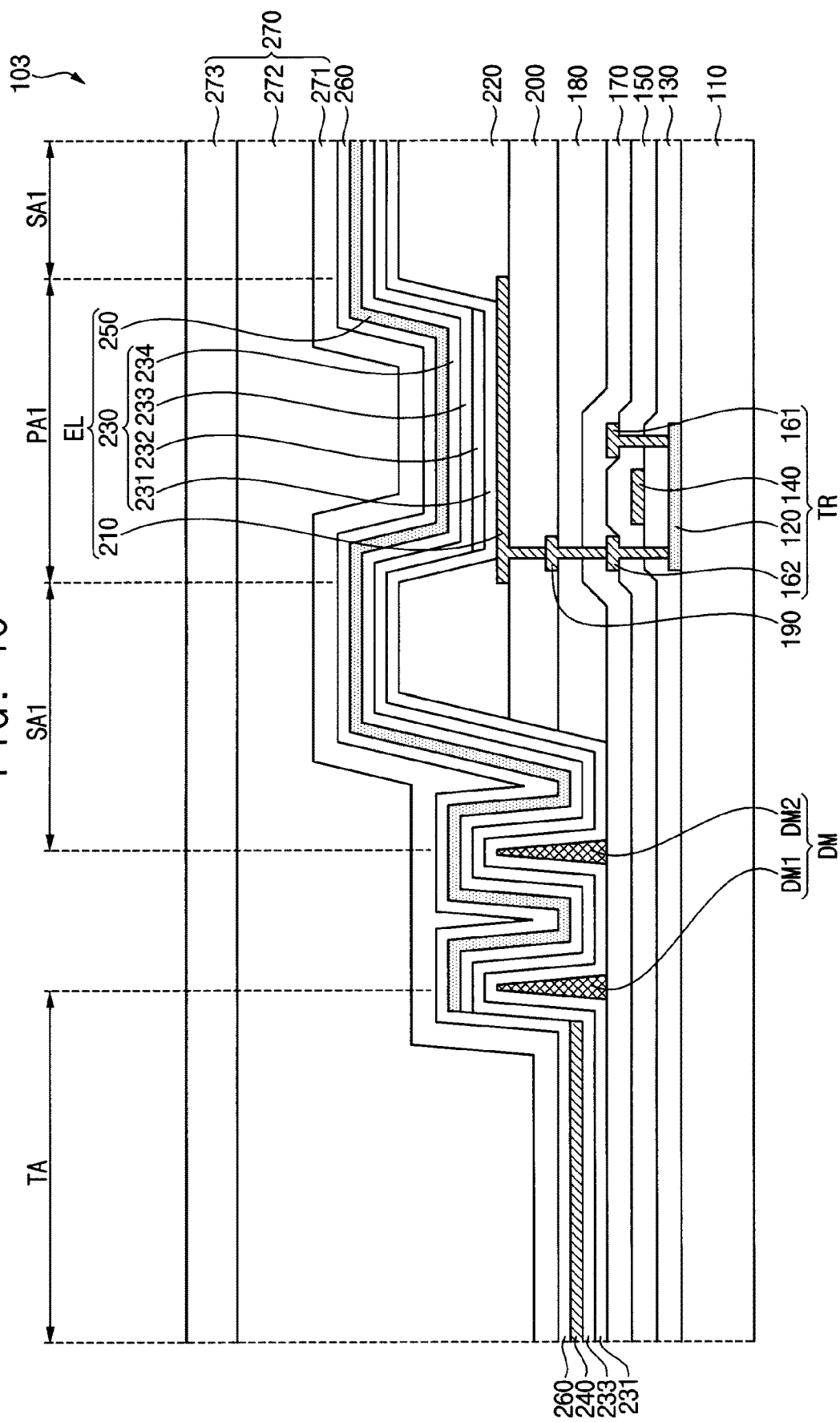
FIG. 10 is a cross-sectional view of another embodiment of the display device of FIG. 1.

FIG. 10 is a cross-sectional view illustrating a display device according to an embodiment. The display device 103 described with reference to FIG. 10 may be substantially the same as or similar to the display device 100 described with reference to FIG. 4 except for the dam DM including a plurality of dams. Accordingly, descriptions on repeated elements will be omitted for descriptive convenience.

Referring to FIG. 10, in embodiments, the at least one dam DM may include a plurality of dams. In an embodiment, the at least one dam DM may include a first dam DM1 and a second dam DM2 spaced apart from the first dam DM1. However, embodiments are not limited thereto, and in another embodiment, the at least one dam DM may include three or more dams spaced apart from each other.

When a plurality of dams are formed between the transmission area TA and the first pixel area PA1, inflow of fluorine (F) included in the surface control layer 240 to the light emitting element EL disposed in the first pixel area PA1 from the surface control layer 240 disposed in the transmission area TA may be further blocked. For example, although fluorine (F) from the transmission area TA passes through the first dam DM1, the second dam DM2 may block the fluorine (F) from flowing into the first pixel area PA1.

Hereinafter, a display device according to an embodiment will be described with reference to FIG. 11.

Figure 11:
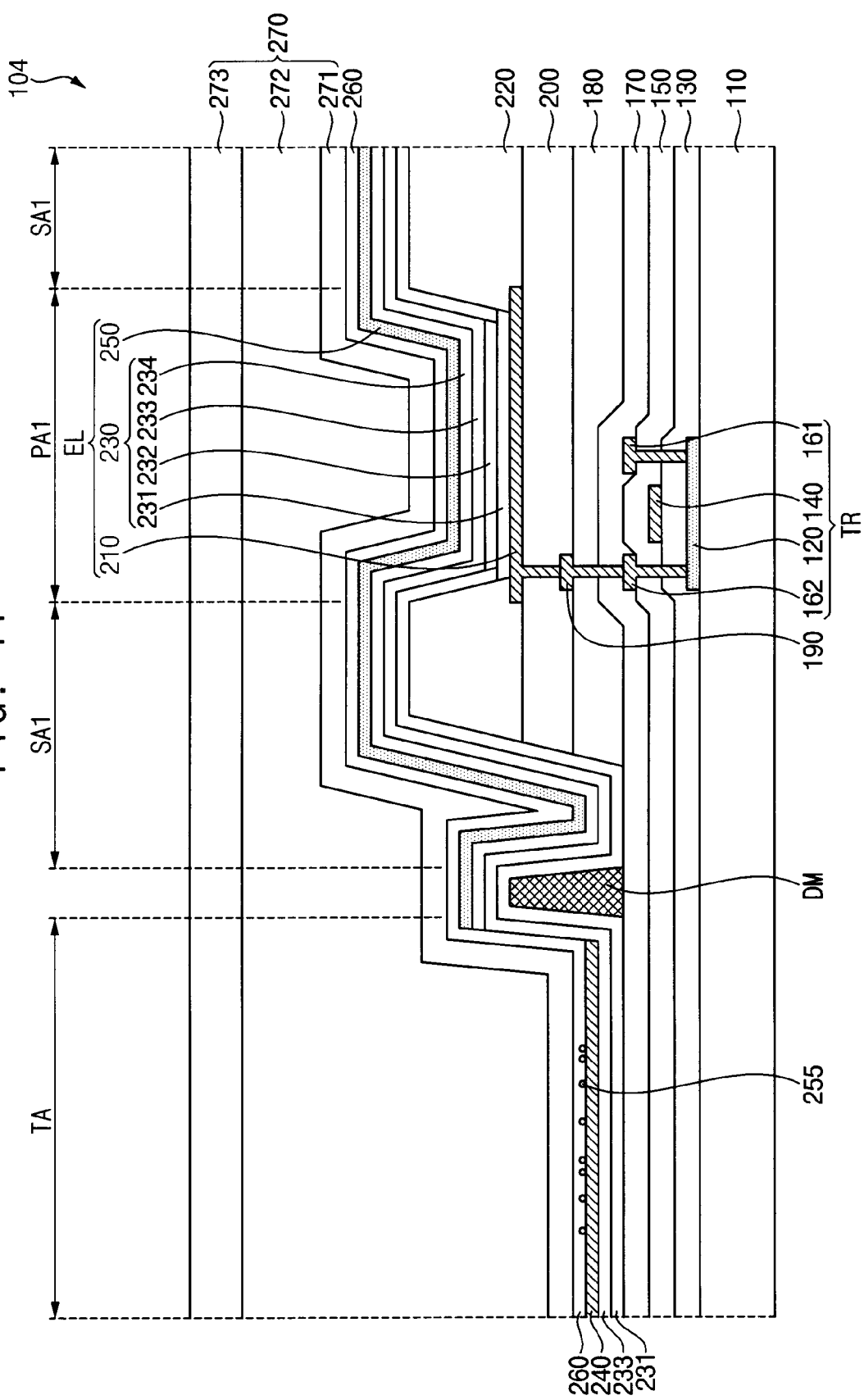
FIG. 11 is a cross-sectional view of another embodiment of the display device of FIG. 1.

FIG. 11 is a cross-sectional view illustrating a display device according to an embodiment. The display device 104 described with reference to FIG. 11 may be substantially the same as or similar to the display device 100 described with reference to FIG. 4 except for further including agglomerated particles. Accordingly, descriptions on repeated elements will be omitted for descriptive convenience.

Referring to FIG. 11, the display device 104 according to an embodiment may further include particles (e.g., agglomerated particles 255) disposed between the surface control layer 240 and the capping layer 260. The agglomerated particles 255 may include a material substantially the same as a material of the electron injection layer 234 and/or the second electrode 250. When the electron injection layer 234 and the second electrode 250 are formed by the metal self-patterning method, the material forming the electron injection layer 234 and/or the material forming the second electrode 250 may be agglomerated, and the agglomerated particles 255 may remain on the surface control layer 240.

Hereinafter, a method of manufacturing a display device according to an embodiment will be described with reference to FIGS. 12, 13, 14, 15, 16, 17, 18, and 19.

FIGS. 12, 13, 14, 15, 16, 17, 18, and 19 are diagrams illustrating a method of manufacturing a display device according to an embodiment.

Figure 12:
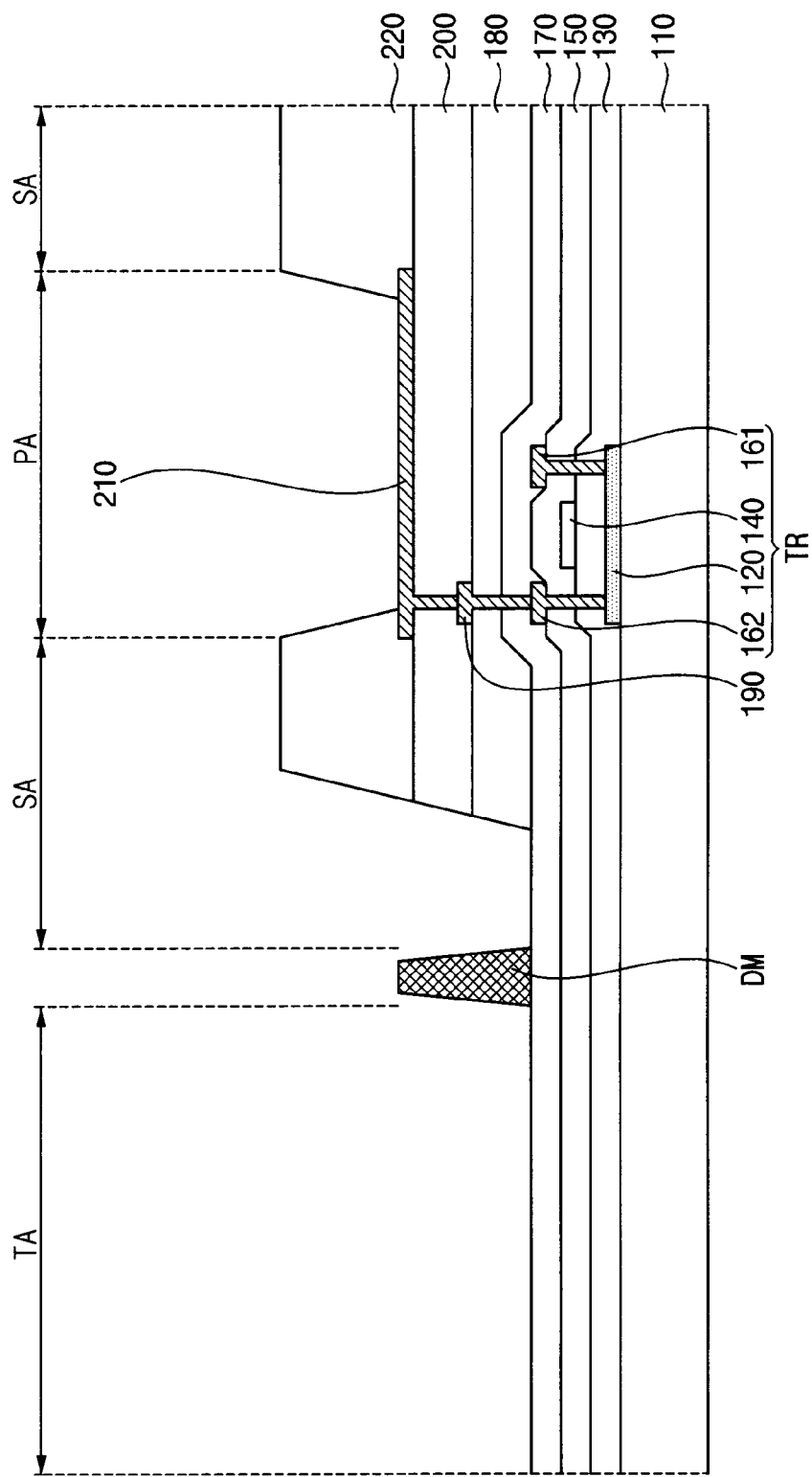
Figure 13:
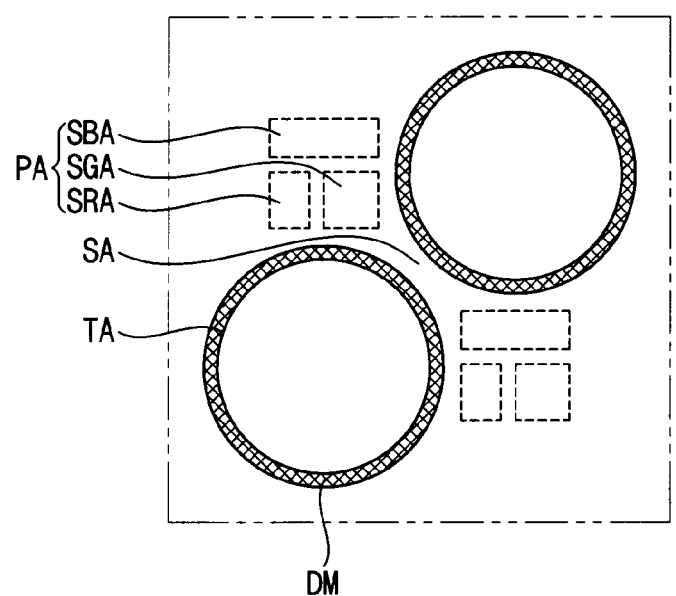

Referring to FIGS. 12 and 13, at least one dam DM may be formed on the substrate 110 on which the first electrode 210 and the pixel defining layer 220 are formed.

First, the active layer 120, the gate insulation layer 130, the gate electrode 140, the insulation interlayer 150, the source and drain electrodes 161 and 162, the passivation layer 170, the first via insulation layer 180, the connection electrode 190, the second via insulation layer 200, the first electrode 210, and the pixel defining layer 220 may be sequentially formed on the substrate 110. In an embodiment, the gate insulation layer 130, the insulation interlayer 150, and the passivation layer 170 may be formed in the pixel area PA, the transmission area TA, and the surrounding area SA, and the active layer 120, the gate electrode 140, the source and drain electrodes 161 and 162, the first via insulation layer 180, the connection electrode 190, and the second via insulation layer 200 may be formed in the pixel area PA and the surrounding area SA, the first electrode 210 may be formed in the pixel area PA, and the pixel defining layer 220 may be formed in the surrounding area SA.

Then, the dam DM may be formed on the passivation layer 170. The dam DM may be formed between the transmission area TA and the surrounding area SA.

In an embodiment, the dam DM may be formed by a coating process and a photolithography process. In another embodiment, the dam DM may be formed by a deposition process such as a sputtering method, a chemical vapor deposition (CVD), etc. and the photolithography process. In still another embodiment, the dam DM may be formed by an inkjet process.

In an embodiment, the dam DM may be formed substantially simultaneously with at least one of the first via insulation layer 180, the second via insulation layer 200, and the pixel defining layer 220. For example, when the dam DM is formed substantially simultaneously with the pixel defining layer 220, a photoresist layer may be formed throughout the pixel area PA, the transmission area TA, and the surrounding area SA on the substrate 110 on which the first electrode 210 is formed, and the photoresist layer may be patterned to substantially simultaneously form the dam DM and the pixel defining layer 220.

Figure 14:
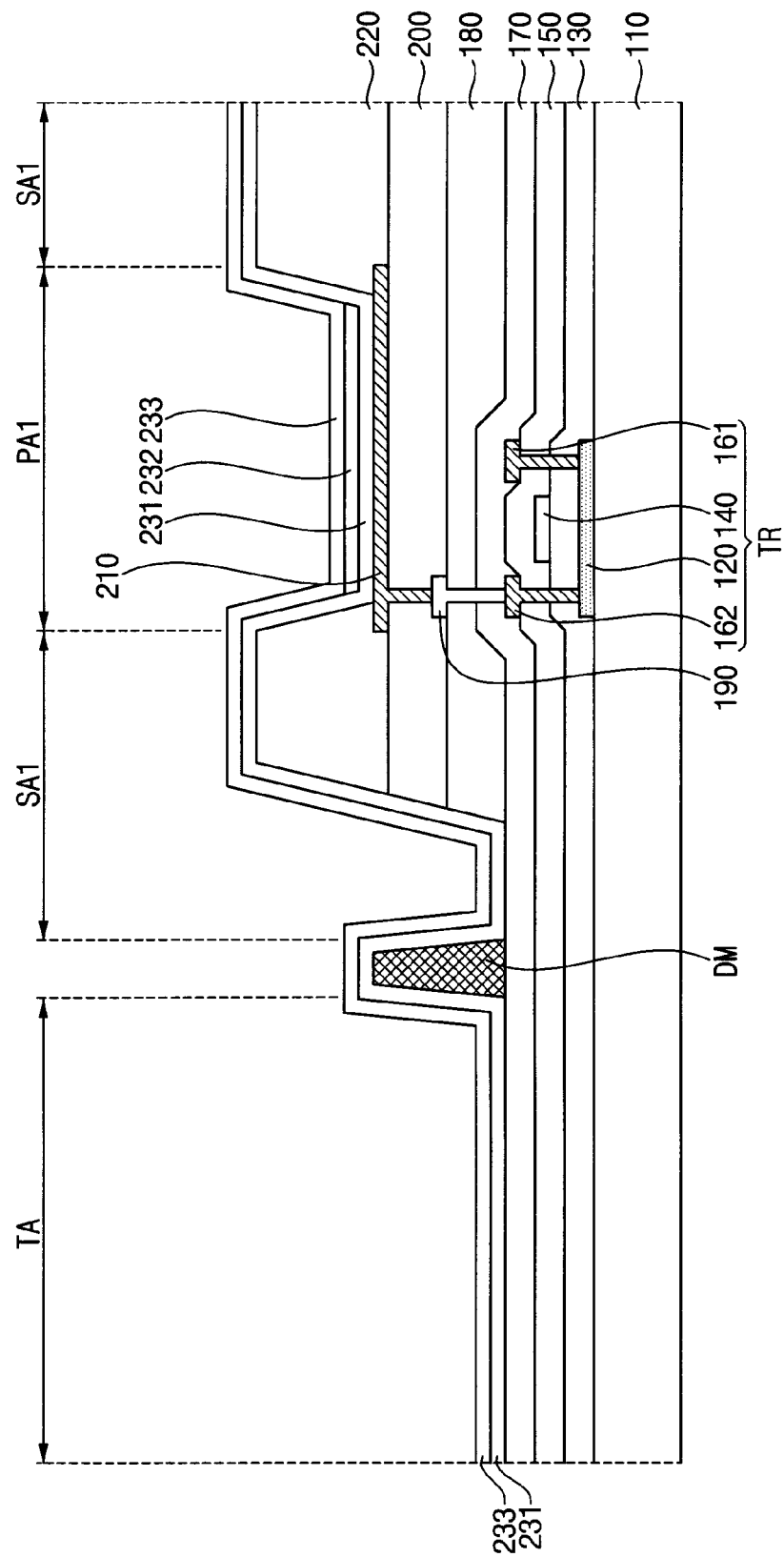

Referring to FIG. 14, the first common layer 231, the emission layer 232, and the second common layer 233 may be sequentially formed on the substrate 110 on which the dam DM is formed. In an embodiment, the first common layer 231 and the second common layer 233 may be formed in the pixel area PA, the transmission area TA, and the surrounding area SA. The emission layer 232 may be formed in the pixel area PA.

Figure 15:
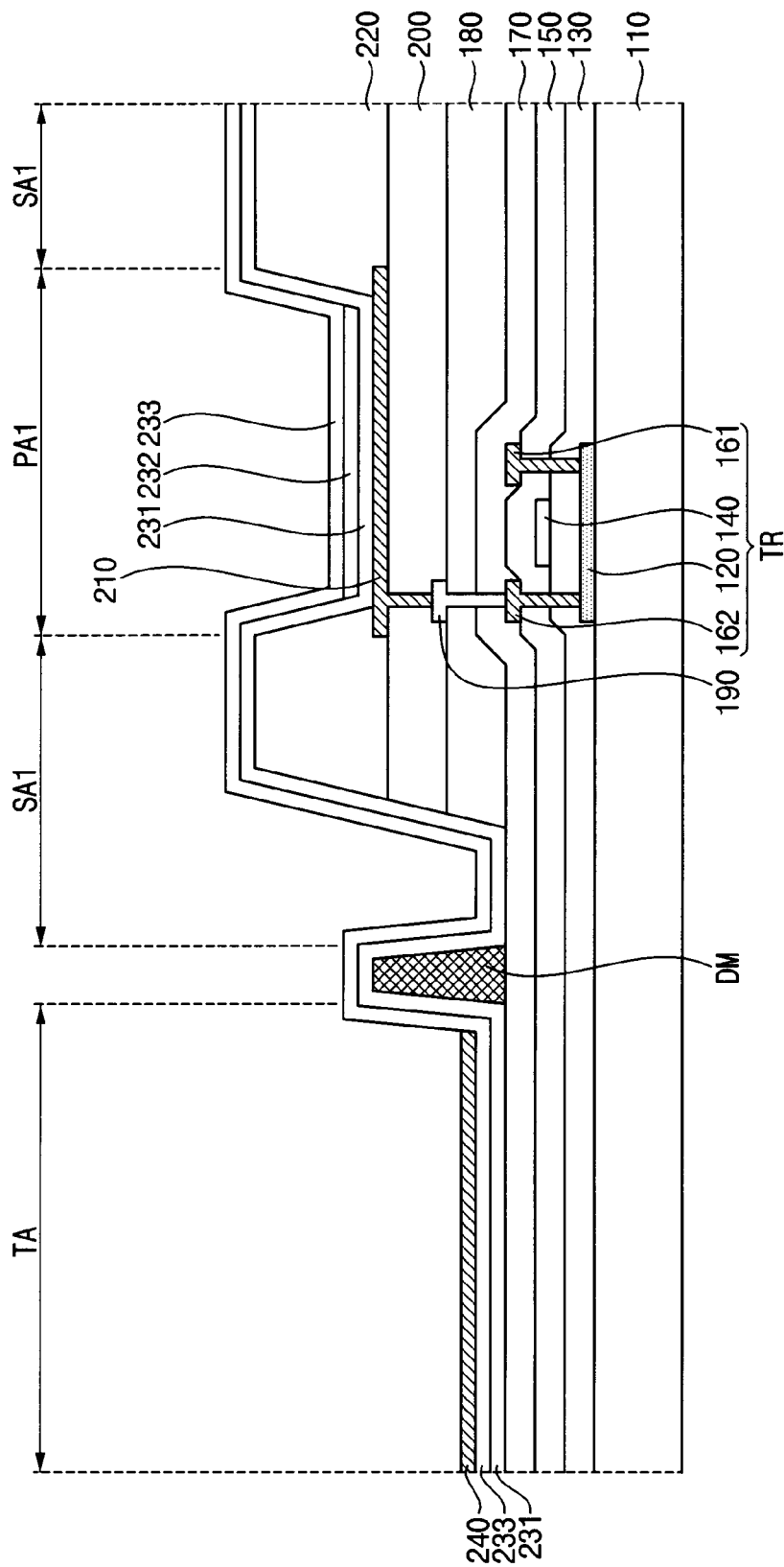
Figure 16:
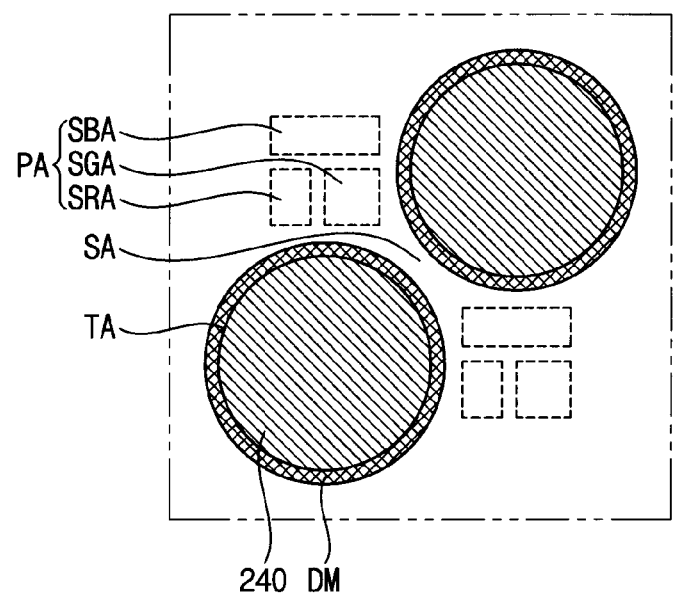

Referring to FIGS. 15 and 16, the surface control layer 240 may be formed on the substrate 110 on which the second common layer 233 is formed. The surface control layer 240 may be formed in the transmission area TA. In an embodiment, the surface control layer 240 may be formed by a vapor deposition such as a chemical vapor deposition (CVD), a physical vapor deposition (PVD), or the like, a wet coating method, a screen printing method, etc.

Figure 17:
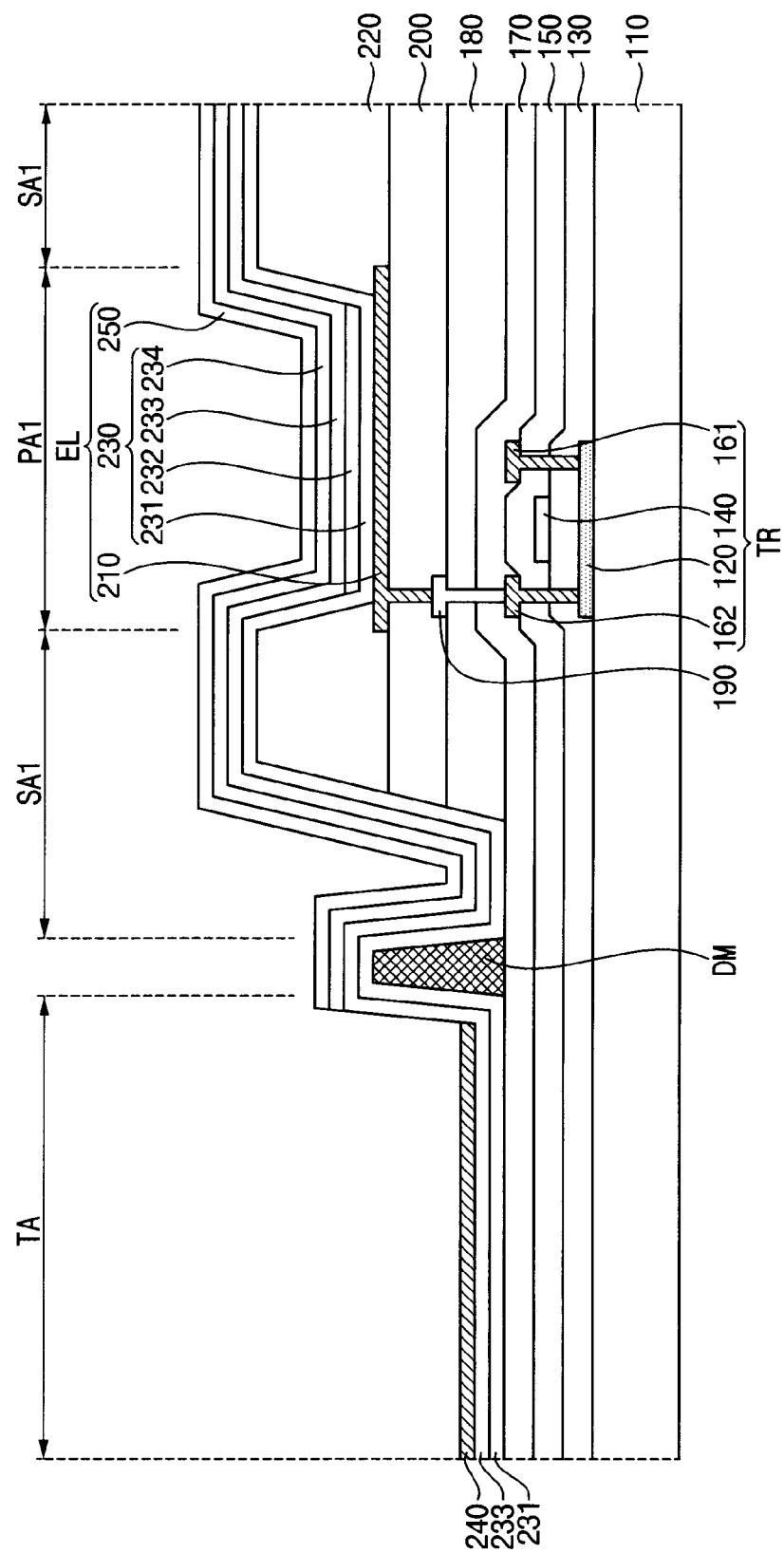
Figure 18:
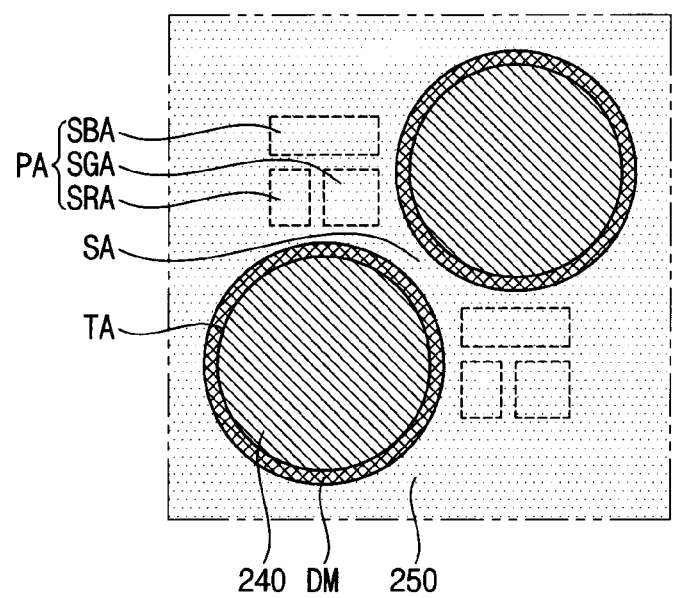

Referring to FIGS. 17 and 18, the electron injection layer 234 and the second electrode 250 may be sequentially formed on the substrate 110 on which the surface control layer 240 is formed.

The electron injection layer 234 and the second electrode 250 may be formed on a portion of the second common layer 233 on which the surface control layer 240 is not formed. In other words, the electron injection layer 234 and the second electrode 250 may be formed in the pixel area PA and the surrounding area SA. The electron injection layer 234 and the second electrode 250 may be formed by a metal self-patterning method. Specifically, the electron injection layer 234 and the second electrode 250 may be formed only on the portion of the second common layer 233 on which the surface control layer 240 is not formed due to a relatively small adhesion between the electron injection layer 234 and the surface control layer 240 and a relatively small adhesion between the second electrode 250 and the surface control layer 240. For example, the patterned electron injection layer 234 and the patterned second electrode 250 may be formed without an additional patterning process.

In an embodiment, the electron injection layer 234 and the second electrode 250 may be formed on the second common layer 233 so as not to overlap the surface control layer 240. However, embodiments are not limited thereto, and in another embodiment, the electron injection layer 234 and the second electrode 250 may be formed on the second common layer 233 so as to overlap only an edge of the surface control layer 240. Further, in the process of forming the electron injection layer 234 and the second electrode 250 by the metal self-patterning method, a material forming the electron injection layer 234 and a material forming the second electrode 250 may be agglomerated, and may remain as agglomerated particles on the surface control layer 240.

Referring to FIG. 19, the capping layer 260 and the encapsulation layer 270 may be sequentially formed on the substrate 110 on which the second electrode 250 is formed. The capping layer 260 and the encapsulation layer 270 may be formed in the pixel area PA, the transmission area TA, and the surrounding area SA.

The display device according to the embodiments may be applied to a display device included in a computer, a notebook, a mobile phone, a smartphone, a smart pad, a PMP, a PDA, an MP3 player, or the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate on which a pixel area for displaying an image and a transmission area for transmitting an external light are defined;
   a transistor disposed on a surface of the substrate in the pixel area;
   a first electrode disposed on the transistor in the pixel area and electrically connected to the transistor;
   a pixel defining layer exposing at least a portion of the first electrode;
   an emission layer disposed on the first electrode in the pixel area;
   a surface control layer disposed on the surface of the substrate in the transmission area;
   at least one dam disposed between the pixel area and the transmission area and surrounding the surface control layer to prevent the surface control layer from extending into the pixel area; and
   a second electrode disposed on the emission layer,
   wherein the at least one dam is spaced apart from the pixel defining layer in a direction parallel to the surface of the substrate, and
   wherein the at least one dam does not overlap the surface control layer in a direction perpendicular to the substrate.

2. The display device of claim 1, wherein the at least one dam has an orthogonal trapezoidal shape in a cross-section view.

3. The display device of claim 1, wherein the at least one dam has an inverted trapezoidal shape in a cross-section view.

4. The display device of claim 1, wherein the at least one dam comprises a first dam and a second dam spaced apart from the first dam.

5. The display device of claim 1, wherein the at least one dam comprises at least one of polyimide, silicon nitride, silicon oxide, silicon oxynitride, molybdenum, copper, aluminum oxide, and titanium oxide.

6. The display device of claim 1, wherein the at least one dam is formed of a material same as a material of the pixel defining layer.

7. The display device of claim 1, further comprising:
   a first via insulation layer disposed between the transistor and the first electrode in the pixel area;
   a second via insulation layer disposed between the first via insulation layer and the first electrode in the pixel area; and
   a connection electrode disposed between the first via insulation layer and the second via insulation layer in the pixel area and connecting the transistor and the first electrode.

8. The display device of claim 7, wherein the at least one dam is formed of a material same as a material of at least one of the first via insulation layer and the second via insulation layer.

9. The display device of claim 1, wherein the second electrode does not overlap the surface control layer.

10. The display device of claim 1, further comprising:
    an intermediate layer disposed on the first electrode and the pixel defining layer in the pixel area, on the surface of the substrate in the transmission area, and on the at least one dam, the intermediate layer including the emission layer and at least one common layer.

11. The display device of claim 10, wherein the intermediate layer further comprises an electron injection layer disposed on the at least one common layer in the pixel area.

12. The display device of claim 11, wherein the electron injection layer does not overlap the surface control layer.

13. The display device of claim 10, wherein the at least one common layer comprises:
    a first common layer disposed on the first electrode and the pixel defining layer in the pixel area, on the surface of the substrate in the transmission area, and on the at least one dam; and
    a second common layer disposed on the first common layer.

14. The display device of claim 13, wherein the emission layer is disposed between the first common layer and the second common layer, and overlaps the first electrode.

15. The display device of claim 13, further comprising a capping layer disposed on the second electrode in the pixel area and on the surface control layer in the transmission area.

16. The display device of claim 15, wherein a thickness of the at least one dam is greater than a sum of a thickness of the first common layer, a thickness of the second common layer, a thickness of the surface control layer, and a thickness of the capping layer.

17. The display device of claim 1, further comprising agglomerated particles disposed on the surface control layer and formed of a material same as a material of the second electrode.

18. The display device of claim 1, wherein the surface control layer comprises a fluorine compound.

19. The display device of claim 18, wherein the fluorine compound comprises at least one of a difluoromethylene group, a trifluoromethyl group, and a fluorosilane.

20. The display device of claim 1, wherein the second electrode comprises at least one of magnesium (Mg), silver (Ag), aluminum (Al), lithium (Li), calcium (Ca), indium (In), and ytterbium (Yb).

21. The display device of claim 1, further comprising an encapsulation layer disposed on the second electrode in the pixel area and on the surface control layer in the transmission area.

22. The display device of claim 21, wherein the encapsulation layer comprises:
a first inorganic encapsulation layer;
an organic encapsulation layer disposed on the first inorganic encapsulation layer; and
a second inorganic encapsulation layer disposed on the organic encapsulation layer.

23. The display device of claim 22, wherein the first inorganic encapsulation layer covers the at least one dam.

24. A display device comprising:
a substrate on which a pixel area for displaying an image and a transmission area for transmitting an external light are defined;
a light emitting element disposed in the pixel area, the light emitting element comprising:
a first electrode disposed on the substrate in the pixel area;
a second electrode disposed to face the first electrode; and
an intermediate layer disposed between the first electrode and the second electrode and comprising a first layer contacting the first electrode and a second layer contacting the second electrode;
at least one dam surrounding the transmission area; and
a surface control layer disposed on the substrate in the transmission area, wherein:
the first layer of the intermediate layer extends from the pixel area to cover the at least one dam and to overlap the surface control layer in the transmission area, and
the second layer of the intermediate layer extends from the pixel area to cover the at least one dam and not to overlap the surface control layer in the transmission area.

25. The display device of claim 24, wherein:
the first layer of the intermediate layer comprises a common layer, and
the second layer of the intermediate layer comprises an electron injection layer.

26. The display device of claim 1, wherein the surface control layer and the second electrode do not overlap each other in the direction perpendicular to the substrate.

27. The display device of claim 1, wherein a bottommost surface of the at least one dam is closer to the substrate than a bottommost surface of the surface control layer.

* * * * *